Figure 1A:
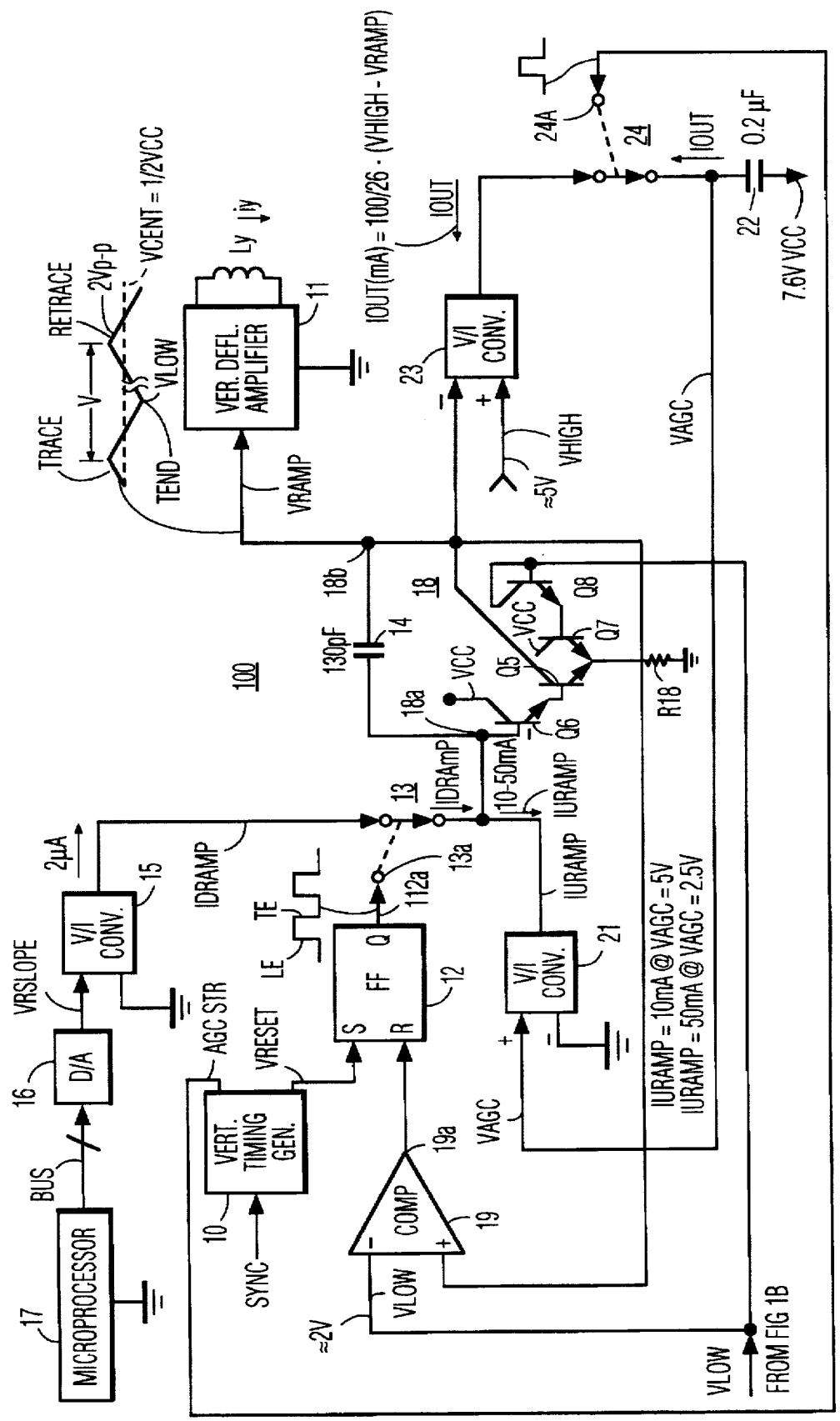

United States Patent [19]
Wilber

[11] Patent Number: 5,703,445
[45] Date of Patent: Dec. 30, 1997

[54] SAWTOOTH GENERATOR WITH DISTURBANCE SIGNAL REJECTION FOR A DEFLECTION APPARATUS

[75] Inventor: James Albert Wilber, Indianapolis, Ind.

[73] Assignee: Thomson Consumer Electronics, Inc., Indianapolis, Ind.

[21] Appl. No.: 624,287

[22] Filed: Mar. 29, 1996

[51] Int. Cl.$^6$ .............................. G09G 1/04; H01J 29/70
[52] U.S. Cl. ............................................ 315/387; 315/408
[58] Field of Search .................................. 315/408, 387

[56] References Cited

U.S. PATENT DOCUMENTS

| | | | |
|---|---|---|---|
| 4,835,727 | 5/1989 | Boon et al. | 364/858 |
| 4,945,292 | 7/1990 | Ackerson et al. | 315/387 |
| 5,216,336 | 6/1993 | Rodriguez-Cavazos | 315/387 |
| 5,250,879 | 10/1993 | Koblitz | 315/403 |
| 5,264,762 | 11/1993 | Wilber | 315/398 |

OTHER PUBLICATIONS

"A New Video Processor For Color TV" by Y. Yamamoto, et al. pp. 443–451.

*Primary Examiner*—Gregory C. Issing
*Attorney, Agent, or Firm*—Joseph S. Tripoli; Joseph J. Laks; Sammy S. Henig

[57] ABSTRACT

In a vertical sawtooth generator, an end time of a retrace portion of a vertical sawtooth signal is controlled by an output signal of a comparator. The comparator has a first input terminal that is responsive to a reference voltage and a second input terminal that is responsive to the sawtooth signal. The reference voltage is coupled to an input terminal of an amplifier of an integrator that generates the sawtooth signal. Any disturbance signal component in the reference voltage is super-imposed on the sawtooth signal. Because the same disturbance signal component is developed simultaneously in both input terminals of the comparator, a high degree of common mode rejection is provided with respect to the disturbance signal component.

13 Claims, 2 Drawing Sheets

SAWTOOTH GENERATOR WITH DISTURBANCE SIGNAL REJECTION FOR A DEFLECTION APPARATUS

The invention relates to a sawtooth generator of a deflection arrangement in a video apparatus.

Typically, a vertical sawtooth generator of a vertical deflection circuit in a television receiver utilizes a current integrating capacitor that is charged from a source of a D.C. current to produce a ramp, trace portion of an output sawtooth signal synchronized to a vertical synchronizing signal. The trace portion of the sawtooth signal controls a trace portion of a vertical deflection current that produces vertical deflection in a cathode ray tube (CRT).

U.S. Pat. No. 5,216,336, in the names of Rodriguez-Cavazos., entitled A GENERATOR FOR SAWTOOTH SIGNAL WITH SELECTABLE RETRACE SLOPE FOR A DEFLECTION APPARATUS, describes a sawtooth generator in which a beginning time of a retrace portion of a vertical sawtooth signal is controlled by a vertical synchronization signal and an end time of the retrace portion is controlled by an output signal of a comparator. The comparator has a first input terminal that is responsive to a reference voltage and a second input terminal that is responsive to the sawtooth signal, during the retrace portion. The end time of vertical retrace is detected in the comparator when the sawtooth signal is equal to the reference voltage. The comparator controls the time at which the retrace portion terminates and the trace portion begins.

An undesirable disturbance signal component may be parasitically contained in the reference voltage. Such disturbance signal component can occur as a result of parasitic coupling of a horizontal rate signal. Because of scanning interlace, the magnitude and the phase of the horizontal rate signal that produces the disturbance signal component in the reference voltage is different in the vicinity of the end time of vertical retrace in alternate fields of the video signal. This disturbance signal component contained in the reference voltage causes the voltage at the beginning of the ramp to be modified by an error voltage that is equal to the disturbance signal component amplitude. The result is that the entire trace portion of the sawtooth signal is offset by the disturbance signal component. Even a disturbance signal component that amounts to only 1/525 of the sawtooth signal amplitude is sufficient to entirely eliminate the desired interlace feature of the displayed fields. It may be desirable to prevent the disturbance signal component from modulating the ramp start voltage so that the desired interlace feature is preserved.

In accordance with an inventive feature, the reference voltage is coupled to an input terminal of an amplifier of an integrator that generates the sawtooth signal. Therefore, the disturbance signal component in the reference voltage is superimposed on the sawtooth signal. As a result, the sawtooth signal contains a signal disturbance component with the same magnitude and phase as the signal disturbance component in the reference voltage. As explained before, the comparator detects the time at which the sawtooth signal is equal to the reference voltage. Advantageously, because the same disturbance signal component is developed simultaneously in both input terminals of the comparator, a high degree of common mode rejection is provided with respect to the disturbance signal component.

A video display apparatus, embodying an aspect of the invention, includes a capacitor and a switch coupled to the capacitor and responsive to a first control signal. A sawtooth signal is generated in the capacitor at a frequency that is related to a deflection frequency. An instant at which a first change in a slope of the sawtooth signal occurs is determined in accordance with the first control signal. A comparator generates the first control signal in accordance with a difference between the sawtooth signal and a reference signal. The sawtooth signal is coupled to a first input of the comparator. The reference signal is coupled to a second input of the comparator and also to the first input of the comparator. A change in the reference signal produces corresponding changes that compensate each other in the first and second inputs of the comparator.

Figure 1B:
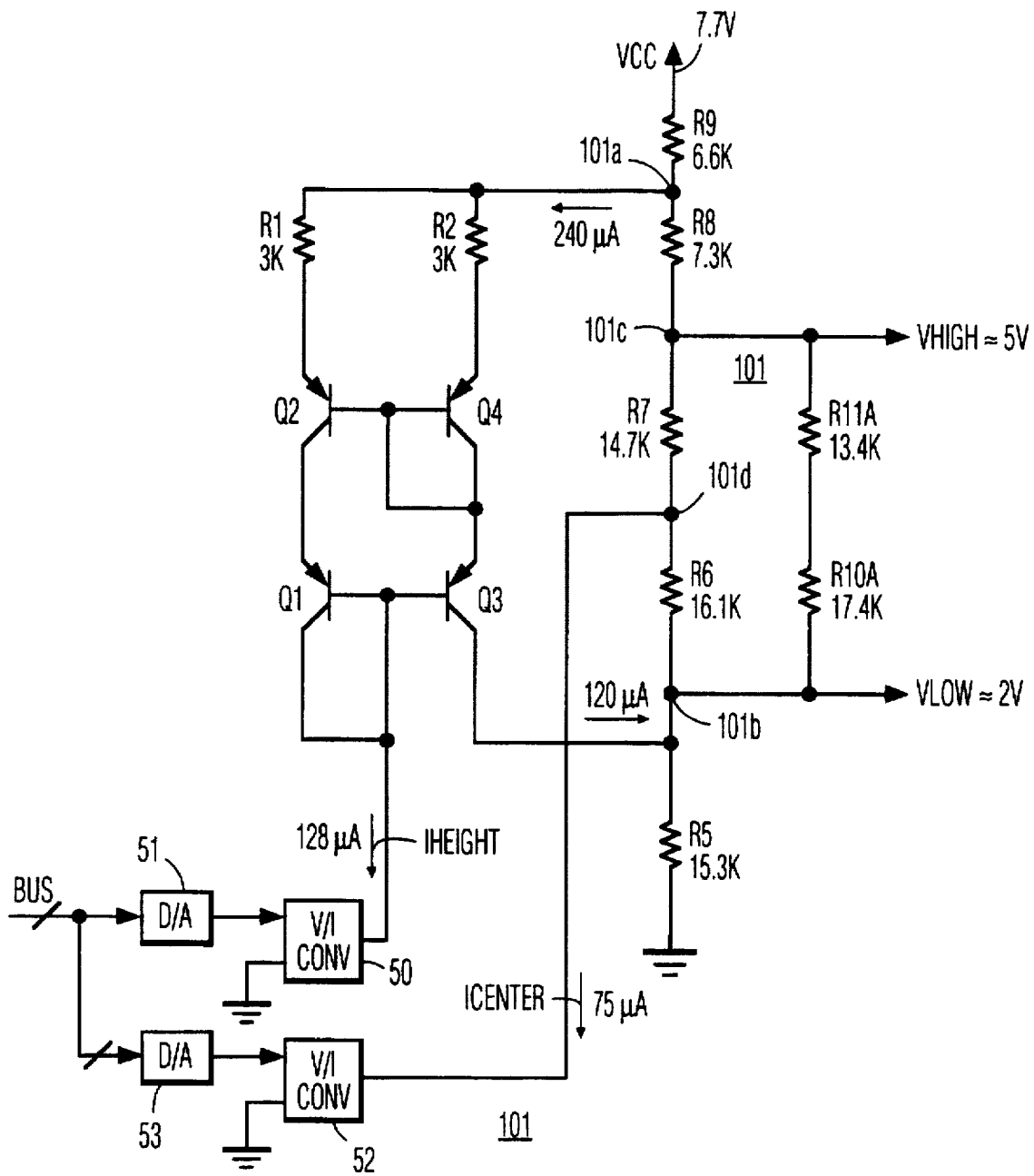

FIGS. 1a and 1b illustrate a vertical sawtooth generator, embodying an aspect of the invention.

FIG. 1a illustrates a portion of a vertical sawtooth generator 100, embodying an aspect of the invention, that is coupled to a vertical deflection circuit 101, shown in FIG. 1b. A vertical synchronizing signal SYNC produced by, for example, a video detector of a television receiver, not shown, that processes a television video signal conforming to the NTSC standard, for example, is coupled to a vertical timing generator 10. Generator 10 generates a vertical rate pulse signal VRESET. Pulse signal VRESET is coupled to a "set" input of a Set-Reset flip-flop 12 causing flip-flop 12 to change states. Consequently, an output Q of flip-flop 12 produces a leading edge LE of an output control signal 112a. Leading edges of signals VRESET and 112a occur at the end of a given vertical trace interval and initiate vertical retrace. Signal 112a is coupled to a control terminal 13a of a current switch 13. Immediately after leading edge LE, signal 112a causes switch 13 to couple a D.C. current IDRAMP to a junction terminal 18a of an integrating capacitor 14 that is fabricated using an integrating circuit (IC) fabrication technique.

Current IDRAMP is produced in a voltage-to-current (V/I) converter 15 that is controlled by a voltage VRSLOPE produced in a digital-to-analog (D/A) converter 16. The digital data input to D/A converter 16 is supplied via a bus BUS from a microprocessor 17.

A second end terminal 18b of integrating capacitor 14 is coupled to a collector electrode of a transistor Q5, forming an output terminal of an amplifier 18 where a sawtooth signal VRAMP is generated. Current IDRAMP produces a retrace portion RETRACE of sawtooth signal VRAMP. Terminal 18a of capacitor 14 is coupled to a base electrode of a transistor Q6 and provides an inverting input terminal (−) of amplifier 18. Amplifier 18 and capacitor 14 form a current integrator.

Signal VRAMP is also coupled to a noninverting input terminal of a comparator 19 that senses the level of signal VRAMP during portion RETRACE to determine an end time TEND of portion RETRACE of signal VRAMP. An inverting input terminal of comparator 19 is coupled to a source 101 of FIG. 1b of a D.C. reference voltage VLOW that is generated in a manner discussed below. An output terminal 19a of comparator 19 is coupled to a "reset" input R of flip-flop 12.

As a result of current IDRAMP, signal VRAMP ramps down and attains a level that is equal to voltage VLOW, at time TEND. Comparator 19 produces an output signal that causes flip-flop 12 to change states and to produce, at output Q, a trailing edge TE of signal 112a. Thereafter, current IDRAMP is decoupled from capacitor 14 by switch 13. The magnitude of current IDRAMP is programmable, in accordance with the value of the digital data input to D/A converter 16, for providing the required retrace slope or length of portion RETRACE of signal VRAMP.

A D.C. current IURAMP that is substantially smaller than current IDRAMP is produced in a V/I converter 21.

After trailing edge TE of signal 112a, current IURAMP that is coupled to terminal 18a of capacitor 14 charges capacitor 14 to produce a ramping trace portion TRACE of sawtooth signal VRAMP of FIG. 2b. The magnitude of current IURAMP of V/I converter 21 of FIG. 1a is controlled in an automatic gain control (AGC) feedback loop by a voltage VAGC, developed across a capacitor 22. Voltage VAGC controls converter 21 such that the more positive is voltage VAGC, the smaller is current IURAMP. An AGC strobe signal AGCSTR is coupled to a control terminal 24a of a switch 24.

Signal AGCSTR is produced in vertical timing generator 10 close to the end of vertical trace in a similar manner that is described in the aforementioned Rodriguez-Cavazos patent. Signal AGCSTR has a pulse width that is equal to the length of, for example, a horizontal video line or 64 microseconds. During the occurrence of the pulse of signal AGCSTR, a current IOUT, generated in a V/I converter 23, is coupled via a switch 24 to capacitor 22. Outside of the occurrence of the pulse of signal AGCSTR, capacitor 22 maintains its voltage approximately at a constant level to provide sample-and-hold operation. The magnitude of current IOUT is controlled in converter 23 is proportional to a difference between signal VRAMP and a reference voltage VHIGH, that is produced in a manner described later on.

During a given trace interval, should the magnitude of signal VRAMP be, for example, smaller than voltage VHIGH when strobe signal AGCSTR occurs, current IOUT would be positive and at a magnitude that is proportional to the difference between voltage VHIGH and signal VRAMP. Positive current IOUT causes a decrease of voltage VAGC in capacitor 22. Consequently, in subsequent vertical trace intervals, current IURAMP would be larger and the rate of increase of signal VRAMP would be greater than before in a manner to compensate for the aforementioned tendency of signal VRAMP to be smaller than required. Thus, the AGC feedback loop causes the magnitude of signal VRAMP to be at the same level of voltage VHIGH, when strobe signal AGCSTR occurs.

Signal VRAMP is waveform corrected for providing S-shaping, in a manner not shown, and D.C. coupled to, for example, a D.C. coupled linear vertical deflection circuit 11 for producing a vertical deflection current 11 in a vertical deflection winding Ly.

FIG. 1b illustrates arrangement 101, for generating voltages VHIGH and VLOW of FIG. 1a, referred to before. Arrangement 101 includes a resistor R9 having a terminal that is coupled to a supply voltage VCC of 7.7 volts. A second terminal, 101a, of resistor R9 is coupled to a resistor R8. A terminal 101c of resistor R8 is coupled to a series arrangement of resistors R7 and R6. The series arrangement of resistors R7 and R6 is coupled between terminal 101c and a terminal 101b. A resistor R5 is coupled between terminal 101b and ground. A second series arrangement of resistors R11A and R10A is coupled between terminals 101b and 101c, in parallel with the series arrangement of resistors R7 and R6. Voltage VLOW is developed at terminal 101b and voltage VHIGH is developed at terminal 101c, as explained in the in the aforementioned Rodriguez-Cavazos patent.

A V/I converter 50 of FIG. 1b that is controlled by input data received via bus BUS from microprocessor 17 of FIG. 1a and via a D/A converter 51 of FIG. 1b produces a D.C. current IHEIGHT of FIG. 1b that is coupled both to the base and to the collector of a transistor Q1, coupled in a diode configuration. The base and collectors of transistor Q1 are coupled to the base of a transistor Q3 to control a collector current in transistor Q3 that is equal to current IHEIGHT.

The collector of transistor Q3 is coupled to terminal 101b between resistors R5 and R6. Collector base electrodes of a transistor Q4 are coupled together in a diode configuration and also coupled to the emitter of transistor Q3 for supplying the current of transistor Q3. The emitter of transistor Q4 is coupled via a resistor R2 to terminal 101a. The base of transistor Q2 is coupled to the base and to the collector of transistor Q4. The emitter of transistor Q2 is coupled via a resistor R1 to terminal 101a. A collector of transistor Q2 is coupled to the emitter of transistor Q1 for supplying the collector current of transistor Q1.

Transistors Q1, Q2, Q3 and Q4 form a temperature compensated current mirror arrangement. The sum of the emitter currents of transistors Q2 and Q4 that flow in resistors R1 and R2, respectively, is supplied via terminal 101a and is equal to twice the value of current IHEIGHT. Whereas, the collector current of transistor Q3, that is coupled to terminal 101b, is equal to current IHEIGHT.

The level of current IHEIGHT is controlled to establish the required peak-to-peak amplitude of signal VRAMP of FIG. 1a by establishing the levels of voltages VHIGH and VLOW. An adjustment of current IHEIGHT causes voltages VHIGH and VLOW to change in opposite directions, as explained in the aforementioned Rodriguez-Cavazos patent.

A V/I converter 52 that is controlled by input data received via bus BUS from microprocessor 17 of FIG. 1a and via a D/A converter 53 produces a D.C. current ICENTER of FIG. 1b. Current ICENTER is coupled between resistors R6 and R7. Current ICENTER provides adjustment of the average value of signal VRAMP by adjusting voltages VLOW and VHIGH so as to adjust vertical centering.

Voltage VLOW is coupled to a base electrode of a transistor Q8 of amplifier 18 of FIG. 1a. The base electrode of transistor Q8 forms a non-inverting input terminal of amplifier 18. Transistor Q8 has its collector electrode coupled to its base electrode in a diode configuration. An emitter electrode of transistor Q8 is coupled to a base electrode of a transistor Q7 of amplifier 18. The emitter electrodes of transistors Q7 and Q5 are coupled to each other and to a common emitter resistor R18. Thus, transistors Q5, Q6, Q7 and Q8 form a temperature compensated differential amplifier.

Assume, hypothetically, that a disturbance signal component is contained in voltage VLOW in the vicinity of time TEND of signal VRAMP. Such disturbance signal component can occur as a result of parasitic coupling of a horizontal rate signal to supply voltage VCC from other parts of the video equipment, not shown. Because of scanning interlace, the magnitude and the phase of the horizontal rate signal, that can produce the disturbance signal component in voltage VLOW, is different in the vicinity of time TEND of signal VRAMP in alternate fields of the video signal, not shown.

In accordance with an inventive feature, because voltage VLOW is coupled to the non-inverting input terminal of amplifier 18, the disturbance signal component in voltage VLOW is also super-imposed on signal VRAMP. Therefore, signal VRAMP contains a disturbance signal component with the same magnitude and phase as the disturbance signal component in voltage VLOW. As explained before, comparator 19 senses or detects the level of signal VRAMP, during portion RETRACE, to determine end time TEND of portion RETRACE of signal VRAMP when signals VRAMP and voltage VLOW are equal.

Advantageously, because the disturbance signal components in both the inverting and non-inverting input terminals of comparator 19 have the same magnitude and phase, a high degree of common mode rejection is provided with respect to the disturbance signal component in voltage VLOW. Therefore, the time of edge TE of output signal 112a of flip-flop 12 is not affected by the disturbance signal component. Consequently, advantageously, end time TEND of signal VRAMP will also not be affected. Had end time TEND been affected by the disturbance signal component in voltage VLOW, trace portion TRACE of signal VRAMP could be, undesirably, phase modulated.

What is claimed is:

1. A video display apparatus, comprising:

a capacitor;

a switch coupled to said capacitor and responsive to a first control signal for generating in said capacitor a sawtooth signal at a frequency that is related to a deflection frequency, an instant at which a first change in a slope of said sawtooth signal occurs being determined in accordance with said first control signal; and a comparator for generating said first control signal in accordance with a difference between said sawtooth signal and a reference signal, said sawtooth signal being coupled to a first input of said comparator and said reference signal being coupled to a second input of said comparator and also to said first input of said comparator, a change in said reference signal producing corresponding changes that compensate each other in said first and second inputs of said comparator.

2. An apparatus according to claim 1 wherein said reference signal is coupled to each of said first and second inputs of said comparator in a manner to provide for common mode rejection with respect to a disturbance signal component in said reference signal.

3. An apparatus according to claim 1 further comprising, an amplifier having an output coupled to said capacitor to form a signal integrator, wherein said reference signal is coupled to said first input of said comparator via said signal integrator.

4. An apparatus according to claim 3 wherein said amplifier comprises a first transistor, wherein said capacitor is coupled between a control terminal and a first main current conducting terminal of said transistor and wherein said source of reference signal is coupled to a second main current conducting terminal of said first transistor.

5. An apparatus according to claim 4 further comprising, a second transistor having a main current conducting terminal that is coupled to said second main current conducting terminal of said first transistor to form with said first transistor a differential amplifier wherein said reference signal is coupled to said second main current conducting terminal of said first transistor via said second transistor and wherein said control signal is generated at an end of a retrace portion of said sawtooth signal.

6. An apparatus according to claim 1 further comprising, a vertical deflection amplifier coupled to a vertical deflection winding wherein said sawtooth signal is coupled to said vertical deflection amplifier to control a vertical deflection current.

7. An apparatus according to claim 1 further comprising, an amplifier coupled to said capacitor to form a signal integrator wherein said source of said reference signal is coupled to said first input of said comparator via a signal path that includes said signal integrator and to said second input via a signal path that bypasses said signal integrator in a manner to provide for common mode rejection with respect to a disturbance signal component in said reference signal.

8. An apparatus according to claim 1 wherein said switch is responsive to a second control signal at a frequency that is related to a deflection frequency for controlling when a second change in said slope of said sawtooth signal occurs.

9. A video display apparatus, comprising:

a source of a reference signal, said reference signal being subject to a disturbance component;

a waveform generator responsive to a first control signal for generating a sawtooth signal at a frequency related to a deflection frequency, said control signal determining an instant at which a first change in slope of said sawtooth signal occurs, said waveform generator being responsive to said reference signal and said sawtooth signal being subject thereby to said disturbance component; and a comparator for generating said first control signal in accordance with a difference between said sawtooth signal and said reference signal, said disturbance component, present in each of said sawtooth signal and said reference signal, being substantially rejected in said comparator.

10. An apparatus according to claim 9 further comprising, an amplifier having an output coupled to a capacitor to form a signal integrator, wherein said reference signal is coupled to said comparator via said signal integrator.

11. An apparatus according to claim 10 wherein said amplifier comprises a first transistor, wherein said capacitor is coupled between a control terminal and a first main current conducting terminal of said transistor and wherein said source of reference signal is coupled to a second main current conducting terminal of said first transistor.

12. An apparatus according to claim 11 further comprising, a second transistor having a main current conducting terminal that is coupled to said second main current conducting terminal of said first transistor to form with said first transistor a differential amplifier wherein said reference signal is coupled to said second main current conducting terminal of said first transistor via said second transistor and wherein said control signal is generated at an end of a retrace portion of said sawtooth signal.

13. An apparatus according to claim 9 further comprising, a vertical deflection amplifier coupled to a vertical deflection winding wherein said sawtooth signal is coupled to said vertical deflection amplifier to control a vertical deflection current.

* * * * *